United States Patent
Meftah et al.

(10) Patent No.: US 9,750,143 B2
(45) Date of Patent: Aug. 29, 2017

(54) CONTROL SYSTEM INCLUDING A STATIONARY EMERGENCY STOP BUTTON AND A MOBILE EMERGENCY STOP BUTTON

(71) Applicant: SCHNEIDER ELECTRIC INDUSTRIES SAS, Rueil Malmaison (FR)

(72) Inventors: Tewfik Meftah, Grenoble (FR); Francis Chauvet, Mouthiers (FR); Dominique Benni, Mornac (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 42 days.

(21) Appl. No.: 14/650,419

(22) PCT Filed: Nov. 18, 2013

(86) PCT No.: PCT/EP2013/074028
§ 371 (c)(1),
(2) Date: Jun. 8, 2015

(87) PCT Pub. No.: WO2014/095192
PCT Pub. Date: Jun. 26, 2014

(65) Prior Publication Data
US 2015/0351260 A1     Dec. 3, 2015

(30) Foreign Application Priority Data

Dec. 20, 2012   (FR) ..................................... 12 62400

(51) Int. Cl.
*H05K 5/00* (2006.01)
*H05K 5/02* (2006.01)
(Continued)

(52) U.S. Cl.
CPC ........... *H05K 5/0017* (2013.01); *H01H 3/022* (2013.01); *H01H 3/12* (2013.01); *H01H 9/0235* (2013.01);
(Continued)

(58) Field of Classification Search
CPC .. H05K 5/0017; H05K 5/0217; H05K 5/0221; H01H 3/12; H01H 9/0235; H01H 3/022; H01H 2239/066; H02J 7/0052
(Continued)

(56) References Cited

U.S. PATENT DOCUMENTS 7,577,497 B2 * 8/2009 Johannessen .......... B25J 9/1674
318/568.11
7,747,003 B2 * 6/2010 Regen ................ H01R 13/4532
379/430
(Continued)

FOREIGN PATENT DOCUMENTS

DE           90 03 507 U1     5/1990
DE           EP 1519336 A2 *  3/2005 ............. G08C 17/02
(Continued)

OTHER PUBLICATIONS

International Search Report Issued Feb. 3, 2014 in PCT/EP13/074028 Filed Nov. 18, 2013.

*Primary Examiner* — Tuan T Dinh
*Assistant Examiner* — Rockshana Chowdhury
(74) *Attorney, Agent, or Firm* — Oblon, McClelland, Maier & Neustadt, L.L.P.

(57) ABSTRACT

A control system including: a stationary control console and a first emergency stop button positioned on the control console, a mobile control unit including a mobile holder and a second emergency stop button arranged on the mobile holder, the control console including at least one cavity, the mobile holder configured to assume a first position in which (Continued)

the second emergency stop button is located inside the cavity to be hidden from a view of a user, and a second position in which the second emergency stop button is outside the cavity.

9 Claims, 8 Drawing Sheets

(51) Int. Cl.
    *H02J 7/00*     (2006.01)
    *H01H 3/12*     (2006.01)
    *H01H 3/02*     (2006.01)
    *H01H 9/02*     (2006.01)

(52) U.S. Cl.
    CPC .......... *H02J 7/0052* (2013.01); *H05K 5/0217* (2013.01); *H05K 5/0221* (2013.01); *H01H 2239/066* (2013.01)

(58) Field of Classification Search
    USPC .................................................. 361/679.41
    See application file for complete search history.

(56) References Cited

U.S. PATENT DOCUMENTS

| | | | |
|---|---|---|---|
| 2008/0046102 A1* | 2/2008 | Kalhoff | G05B 19/4183 700/78 |
| 2008/0086117 A1* | 4/2008 | Cao | A61B 18/20 606/10 |
| 2008/0299804 A1* | 12/2008 | Ronkko | H04M 1/0233 439/142 |
| 2011/0266010 A1* | 11/2011 | Kang | A62C 17/00 169/52 |

FOREIGN PATENT DOCUMENTS

| | | | | |
|---|---|---|---|---|
| EP | 1 229 410 A1 | | 8/2002 | |
| EP | 1 519 336 A2 | | 3/2005 | |
| EP | 1 890 210 A1 | | 2/2008 | |
| GB | 2 198 614 A | | 6/1988 | |
| GB | 2198614 A | * | 6/1988 | ................ F16P 3/12 |

* cited by examiner

CONTROL SYSTEM INCLUDING A STATIONARY EMERGENCY STOP BUTTON AND A MOBILE EMERGENCY STOP BUTTON

TECHNICAL FIELD OF THE INVENTION

The present invention relates to a control system including a fixed emergency stop button and a mobile emergency stop button.

PRIOR ART

Along a production line or around a machine, it is known to arrange emergency stop buttons at a plurality of fixed locations in order to be able to rapidly access the control of the electrical circuit in case of a problem. Furthermore, it is also known to use a wireless emergency stop button in order to allow the operator to act on the control of the electrical circuit at any time, regardless of the position where he is and therefore without having to look for the nearest fixed emergency stop button. Patent GB2198614 proposes a solution including fixed emergency stop buttons and a mobile emergency stop button. The same is true of Patent EP1519336, which describes a solution comprising a remote-control provided with a mobile emergency stop button and a fixed receptacle capable of accommodating the remote-control and proposing a fixed emergency stop button. The mobile emergency stop button and the fixed emergency stop button are arranged in order to control the same electrical circuit. In the latter solution, when the remote-control is placed on its receptacle and it is therefore not being carried by the operator, the fixed emergency stop button present on the receptacle and the mobile emergency stop button present on the remote-control lie next to one another and are both made available to carry out the same action. In this situation, however, the operator may happen not to know on which emergency stop button he should press. The least hesitation could have disastrous consequences.

The object of the invention is therefore to provide a control system which comprises at least one fixed emergency stop button and one mobile emergency stop button and makes it possible to avoid any hesitation by the operator in case of an emergency stop of the electrical circuit.

SUMMARY OF THE INVENTION

This object is achieved by a control system comprising:
a fixed control console and a first emergency stop button positioned on the control console,
a mobile control unit comprising a mobile support and a second emergency stop button arranged on the mobile support,
said system being characterized in that:
the control console comprises at least one cavity,
the mobile support can occupy a first position, in which the second emergency stop button is located inside said cavity so as to be concealed from the view of a user, and a second position, in which the second emergency stop button is outside said cavity.

According to one feature, the control console comprises a first retractable flap closing the access to said cavity.

According to another feature, the control console comprises a second retractable flap closing the access to a recess intended to receive the mobile support.

According to another feature, the second retractable flap carries a fixed control interface.

According to another feature, the control console comprises a lateral opening leading onto a storage space for the mobile support, said storage space comprising the cavity arranged in order to receive the second emergency stop button.

According to another feature, the mobile support is in the form of a tablet on which the second emergency stop button is arranged, and the mobile control unit comprises an additional control interface arranged on the mobile support.

According to another feature, the control console comprises electrical recharging means arranged in order to charge a battery of the mobile control unit when the mobile support is in the first position.

According to another feature, the system comprises means for unlocking the second emergency stop button when the mobile support is moved from its second position to its first position.

According to another feature, the system comprises means for retaining the mobile support in its first position.

BRIEF DESCRIPTION OF THE FIGURES

Other characteristics and advantages will become apparent in the following detailed description, which is provided with reference to the appended drawings, in which.

DETAILED DESCRIPTION OF AT LEAST ONE EMBODIMENT

Figure 1A:
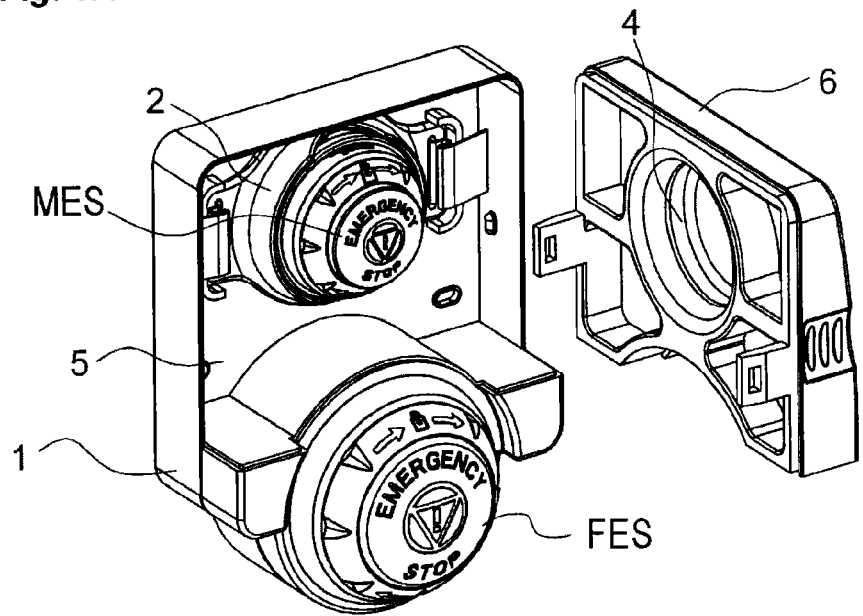
FIGS. 1A to 1C represent a first embodiment of the control system of the invention.

In the rest of the description:
A fixed emergency stop button (FES) means an emergency stop button of the wired type acting directly on the electrical circuit to be controlled.
A mobile emergency stop button (MES) means an emergency stop button having a wireless transmitter capable of communicating with a wireless receiver intended for controlling the electrical circuit.

According to the invention, the control system thus comprises at least one fixed emergency stop button FES and at least one mobile emergency stop button MES. The fixed emergency stop button FES and the mobile emergency stop button MES are arranged in order to control the same electrical circuit (not represented).

According to the invention, the control system comprises a control console 1, 10, 100, 1000 on which the fixed emergency stop button FES is positioned.

The control system also comprises a mobile control unit comprising a mobile support 2, 20, 200, 2000 on which the mobile emergency stop button MES is arranged.

According to the invention, in addition to the mobile emergency stop button MES, the mobile control unit may for example comprise a control interface 30, 300, 3000 formed on the mobile support 20, 200, 2000 in order to be able to send other types of command. This control interface may, for example, be composed of buttons and/or a display screen and/or for example a touch screen. Any other type of control interface may of course be envisioned.

According to the invention, the mobile support 2, 20, 200, 2000 is preferably supplied by a rechargeable battery and communicates with the control console 1, 10, 100, 1000 via a secured (SIL level at least equal to 3) bidirectional wireless communication link. A command resulting, for example, from actuation of the mobile emergency stop button MES or from an action carried out on the control interface 30, 300, 3000 is therefore sent automatically to the control console 1, 10, 100, 1000 via the wireless communication link.

The object of the invention is to provide a solution for storing the mobile emergency stop button when it is not being used by the user, in order to render it inoperable.

This object is achieved by providing a cavity 4, 40, 400, 4000 on the control console 1, 10, 100, 1000, which cavity is arranged in order to receive the mobile emergency stop button MES in order to conceal it from the view of the user.

The mobile support 2, 20, 200, 2000 is thus capable of occupying a first position of storage on the control console 1, 10, 100, 1000, in which the mobile emergency stop button MES is placed in its cavity 4, 40, 400, 4000 so as to be invisible to the user, and a second position in which the mobile emergency stop button MES is extracted from its cavity 4, 40, 400, 4000 and is ready for use.

The control console 1, 10, 100, 1000 comprises, for example, means for charging the mobile control unit, cooperating with said battery when the mobile support 2, 20, 200, 2000 is in its storage position. This recharging is, for example, carried out by induction or physically between a connector formed on the mobile support 2, 20, 200, 2000 and a connector present on the control console 1, 10, 100, 1000.

For example, the fixed and mobile emergency stop buttons correspond to that described in Patent Application WO2012/143191. They are of the type comprising a control knob which can be actuated in translation between an inactive position and an actuated position, an attachment member for holding the knob in its actuated position after depression, and an unlocking ring B which is separate from the control knob and can be actuated in rotation in order to unlock the control knob, that is to say in order to unlatch the control knob from its actuated position and allow it to return to its inactive position. The unlocking ring B comprises, for example, a plurality of notches E in order to make it easier to grip. This architecture is monolithic and proves particularly compact.

According to the invention, the control system may be produced according to the various embodiments detailed below.

Figure 1B:
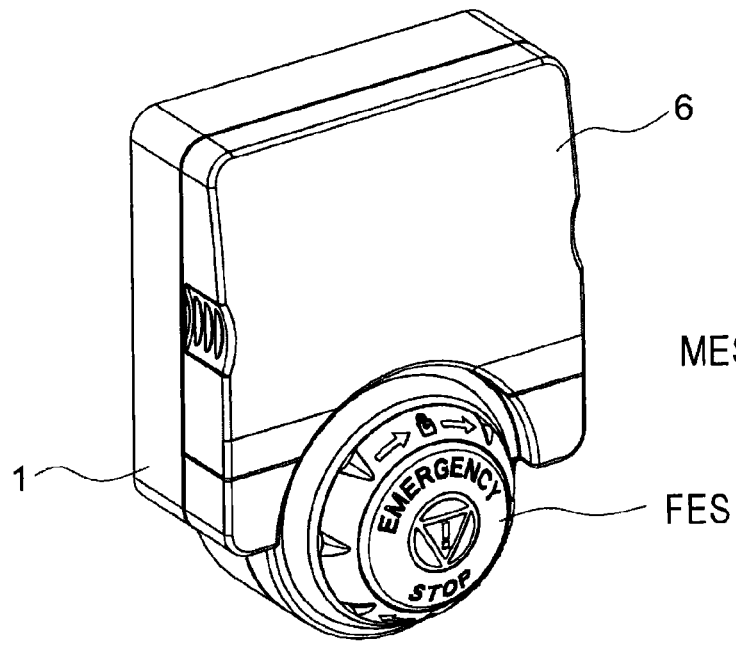
Figure 1C:
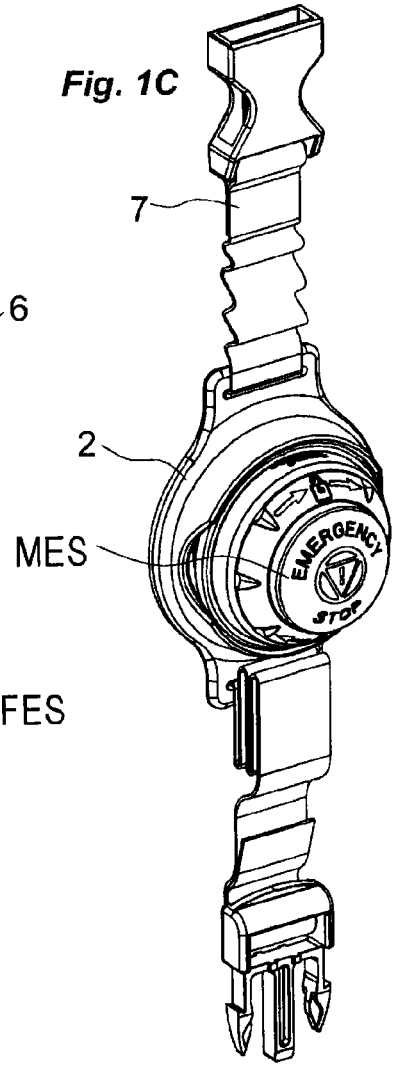

Referring to FIGS. 1A and 1B, the control console 1 comprises a storage compartment 5 intended to receive the mobile support 2. The storage compartment 5 is closed by a cover 6 having a shape adapted to receive the mobile emergency stop button MES. Once the cover 6 is closed on the storage compartment, the mobile emergency stop button MES is invisible to the user's eye and only the fixed emergency stop button FES is accessible directly to him. In the event of a problem, the user present in proximity to the control console 1 will be able to actuate only the fixed emergency stop button FES. During movement, the user can at any time open the cover 6 and grasp the mobile support 2 carrying the mobile emergency stop button MES and housed in the compartment 5. So long as the user remains within a certain radius around the control console 1, the mobile emergency stop button MES is ready to operate. During movement, the mobile support 2 may for example be fitted on a carrying strap 7 intended to be fastened around the body of the user (FIG. 1C).

Figure 2A:
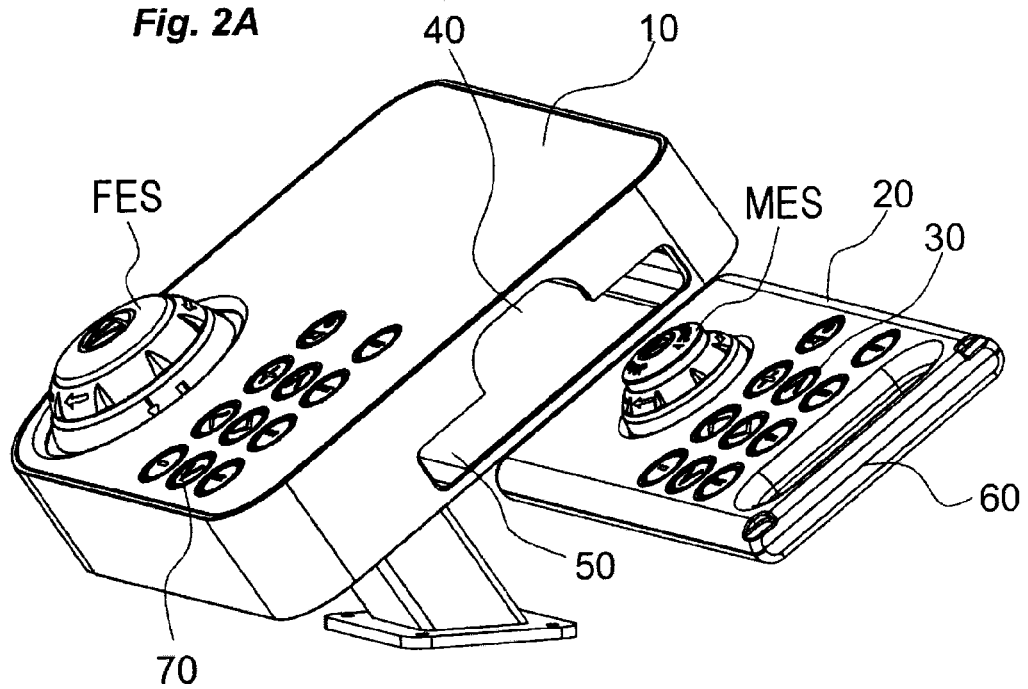
FIGS. 2A and 2B represent a second embodiment of the control system of the invention.
Figure 2B:
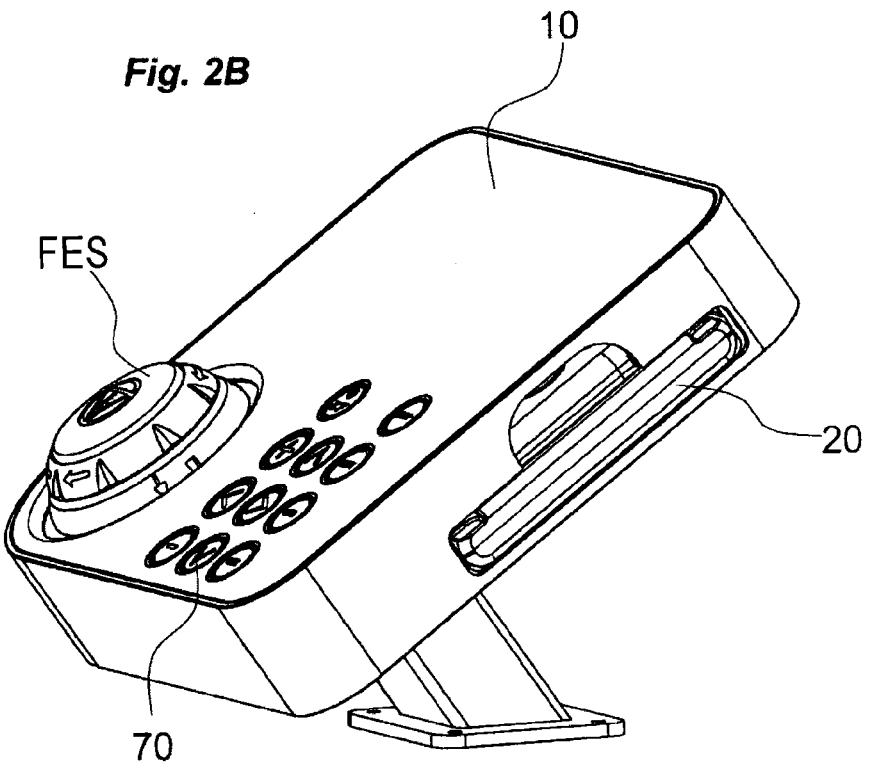
Figure 3A:
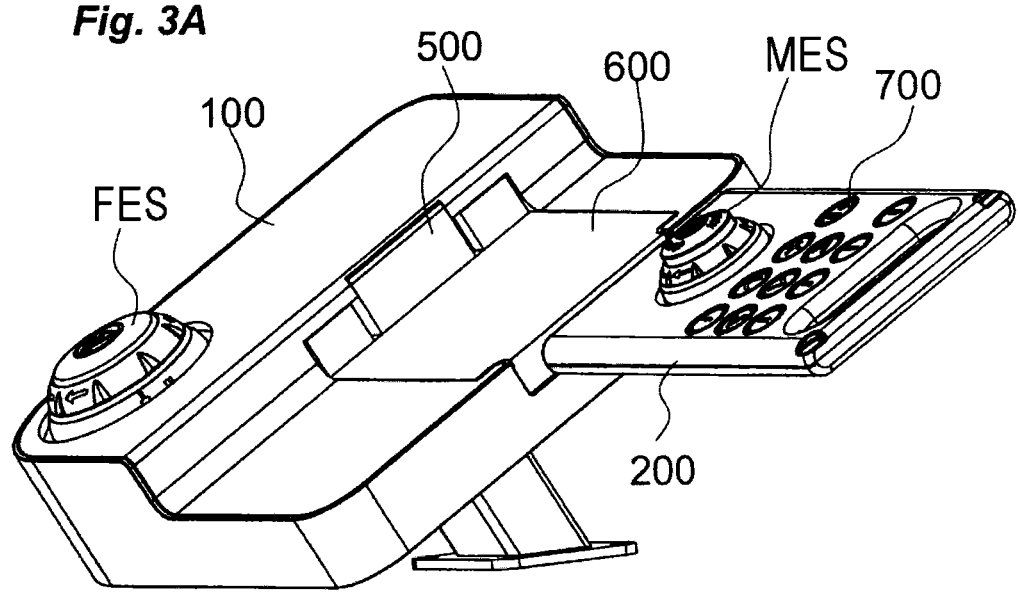
FIGS. 3A to 3F represent a third embodiment of the control system of the invention, FIG. 3D being a cross section along A-A of the plane of FIG. 3C and FIG. 3F being a cross section along B-B of the plane of FIG. 3E, FIGS. 4A and 4B represent an alternative embodiment of the third embodiment of the control system of the invention.
Figure 3B:
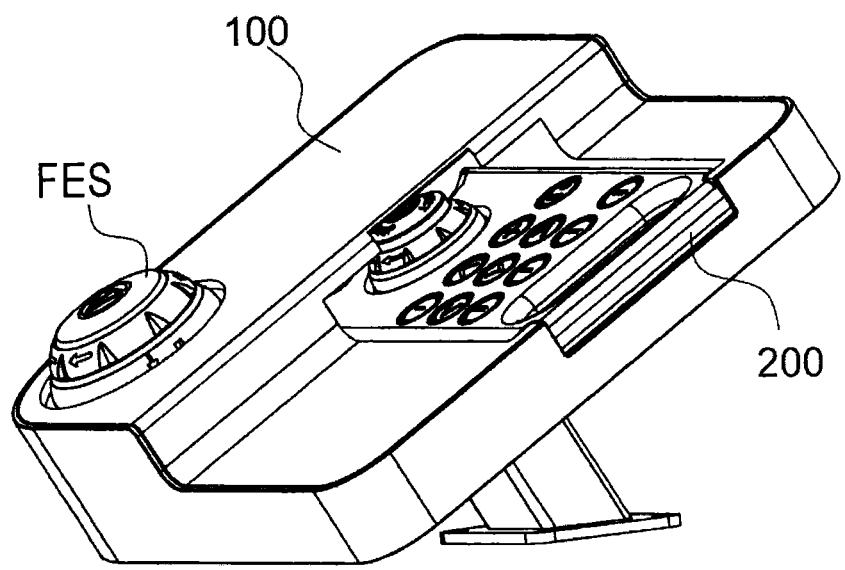
Figure 3C:
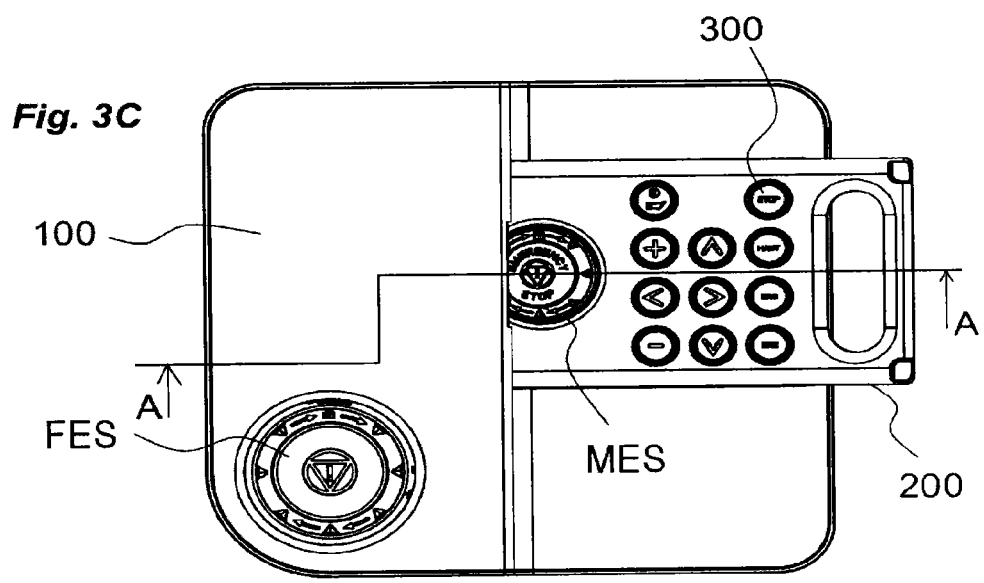
Figure 3D:
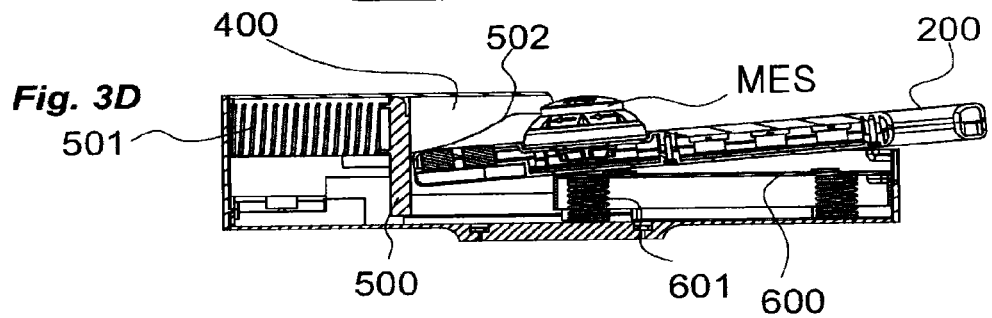
Figure 3E:
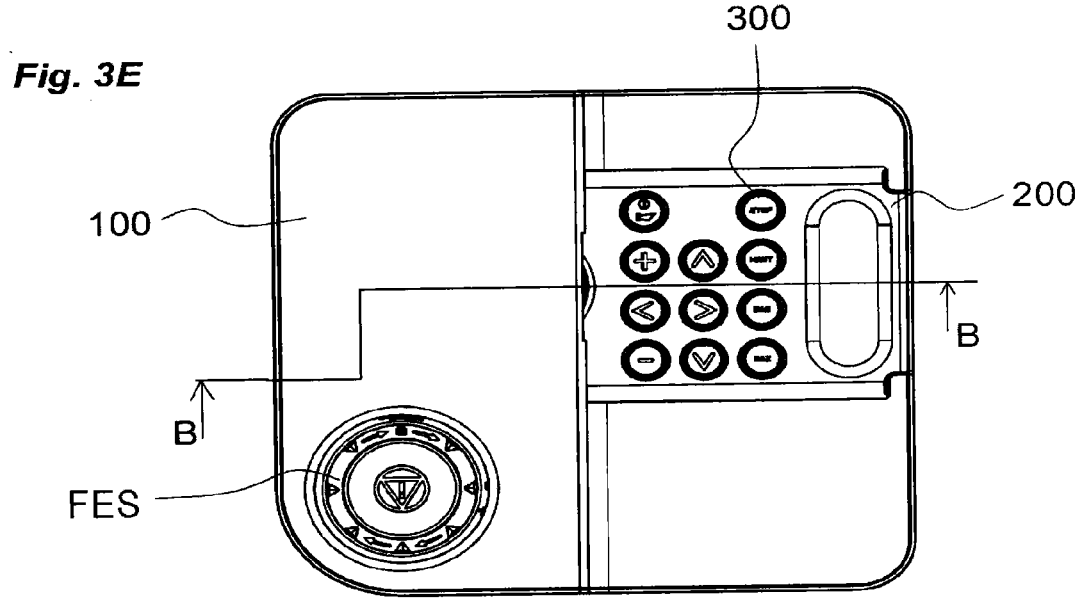
Figure 3F:
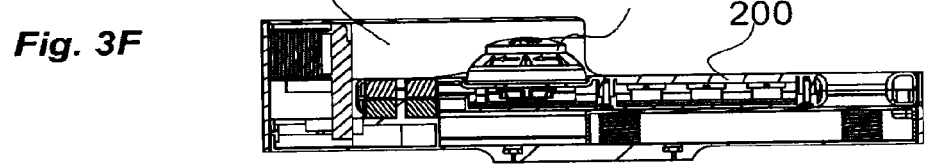

FIGS. 2A and 2B show a second embodiment of the invention. In this embodiment, the control console 10 carrying the fixed emergency stop button FES comprises a lateral opening 50 making it possible to access a storage space intended to accommodate the mobile support 20 carrying the mobile emergency stop button MES. This storage space comprises the cavity 40 intended to accommodate the mobile emergency stop button MES. The control console comprises, for example, a control interface 70 formed in proximity to the fixed emergency stop button FES.

The mobile support 20 is, for example, in the form of a tablet on which the mobile emergency stop button MES is mounted. In this embodiment, the mobile support 20 also comprises a control interface 30 positioned next to the mobile emergency stop button MES. This control interface 30 is, for example, identical to that formed on the control console 10. The tablet may, for example, comprise a handle 60 making it possible to manipulate it and in particular grasp it once it has been inserted into the storage space.

The mobile support 20 is slid in translation through the lateral opening 50 and is pushed into the storage space. The storage space is deep enough for the mobile support 20 to be pushed fully inside the control console 10. The mobile support 20, and therefore the mobile emergency stop button MES, will therefore be fully covered by the control console 10. The lateral opening 50 is designed so as to perfectly match the cross section of the mobile support 20 and, in particular, the prominent shape of the mobile emergency stop button MES.

As in the first embodiment, when the mobile support 20 is inserted into the storage space, the mobile emergency stop button MES is entirely concealed and is no longer available for use.

A third embodiment is presented in FIGS. 3A to 3F. In this third embodiment, the mobile support 200 is also in the form of a tablet, for example identical to that described above for the second embodiment. It therefore comprises the mobile emergency stop button MES, a control interface 300 and a gripping handle. In this embodiment, the control console 100 comprises two flaps 500, 600 retractable in two perpendicular planes. The two flaps 500, 600 are each mounted on one or more springs 501, 601. A first flap 500 makes it possible to access the cavity 400 intended to receive the mobile emergency stop button MES, and a second flap 600 makes it possible to open up a space formed on the control console 100 and intended to be occupied by the tablet. The mobile support 200 is inserted by its edge so as to push the first flap 500 along a first plane against its springs 501 in order to free access to the cavity 400 of the mobile emergency stop button MES. The tablet is guided by ramps 502 as far as the end of said cavity 400 so as to insert the mobile emergency stop button MES into its cavity 400 then against the second flap 600, against its springs 601, so that it occupies the space freed by the second flap 600 and is positioned on the control console 100. The control interface 300 present on the tablet remains visible on the control console 100.

Figure 4A:
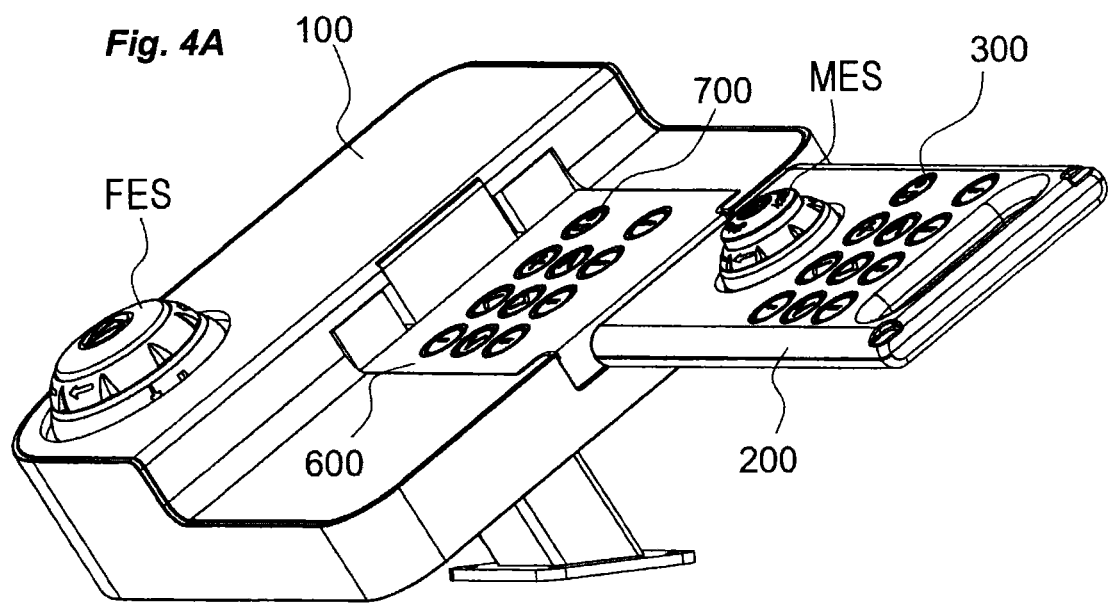
Figure 4B:
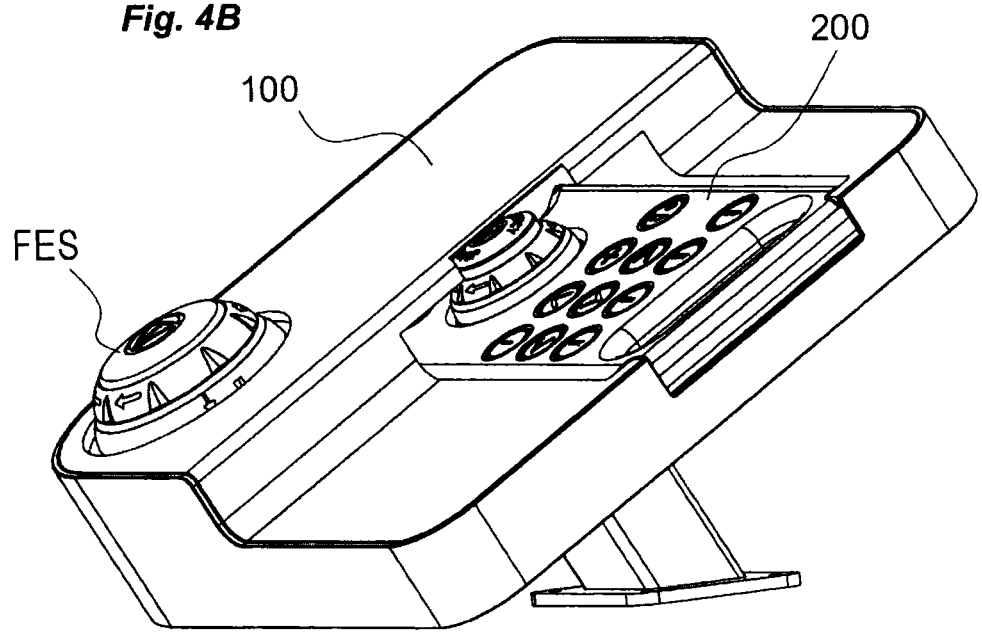

FIGS. 4A and 4B represent an alternative embodiment of the control system of the third embodiment represented in FIGS. 3A to 3F. According to this alternative embodiment, a fixed control interface 7000 is already present on the control console 1000. This control interface 700, for example composed of a plurality of buttons and/or a screen, is formed directly on the second flap 600, which is identical to the one described above. When the tablet is positioned on the control console 100, this fixed control interface 700 is covered by the control interface 300 already present on the tablet. Preferably, the control interface 300 present on the tablet and the fixed control interface 700 are identical. A fixed control interface 700 having functionalities improved in comparison with those present on the tablet could, however, be envisioned.

According to the invention, the control system comprises means for unlocking the knob of the mobile emergency stop button MES. These unlocking means are arranged in order to act on the unlocking ring B of the emergency stop button when the mobile support is inserted into its cavity 40, 400.

Figure 5A:
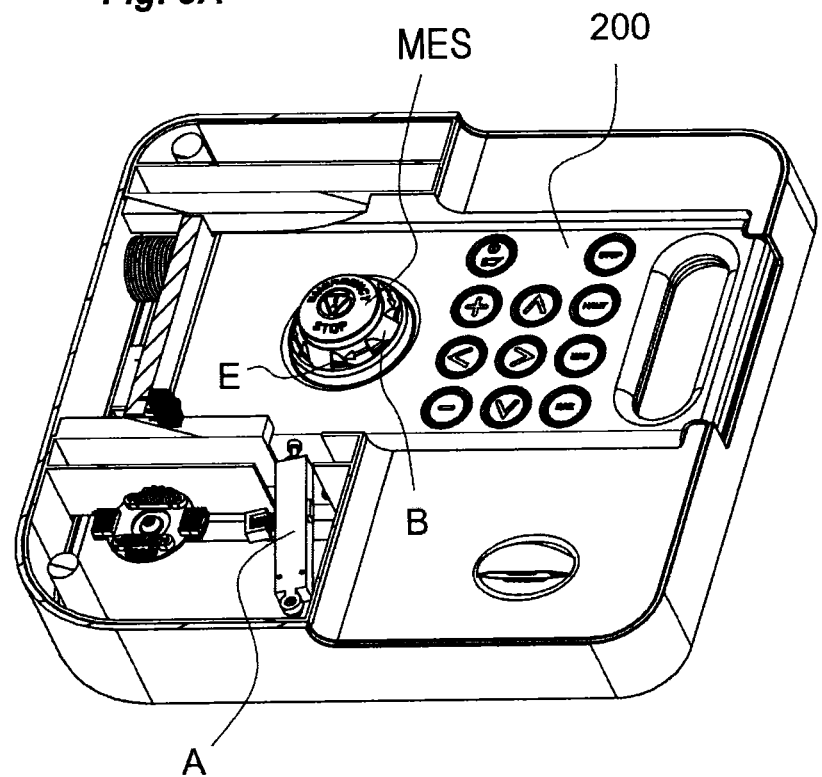
FIGS. 5A and 5B represent a first embodiment of the means for unlocking the mobile emergency stop button when the latter is inserted into its cavity.
Figure 5B:
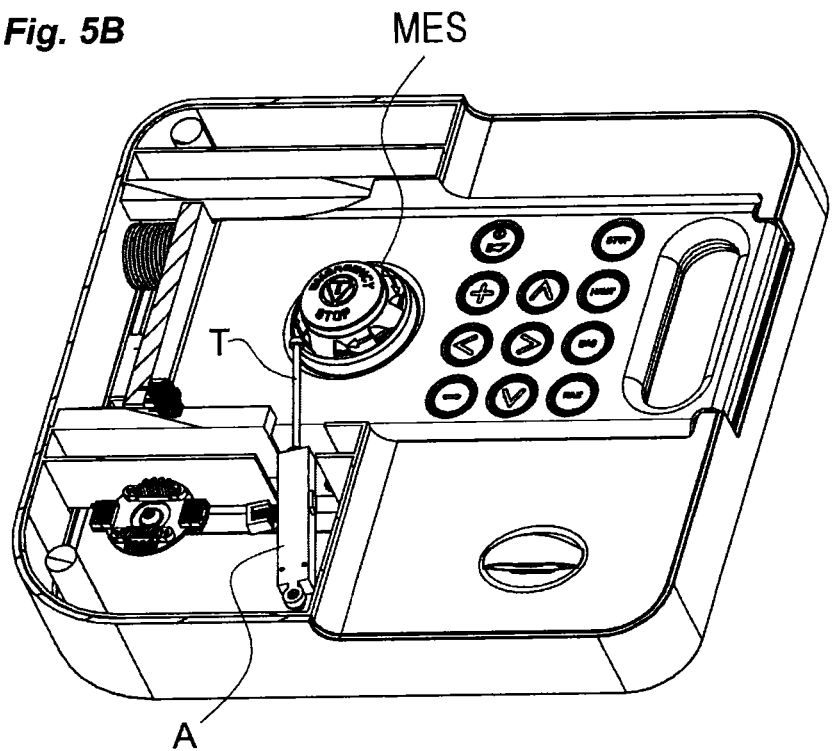

A first embodiment of these unlocking means is represented in FIGS. 5A and 5B. It is described for a control system corresponding to the third embodiment (FIGS. 3A to 3F) or its variant (FIGS. 4A and 4B), which were mentioned above. According to this first embodiment, these unlocking means comprise an actuator A arranged inside the control console in order to act on the unlocking ring B of the mobile emergency stop button MES when the mobile support 200 is inserted into its cavity 400. The means also comprise an end-of-travel sensor arranged in order to detect that the tablet is pushed entirely into its cavity 400 and means for detecting the state, inactive or actuated, of the mobile emergency stop button MES. The actuator comprises, for example, a rod T which can be actuated by an electromagnet and arranged in order to act on the unlocking ring B of the mobile emergency stop button in order to make the knob move from its actuated position to its inactive position when the end-of-travel sensor has detected that the mobile support 200 is pushed fully into its cavity 400.

Figure 6A:
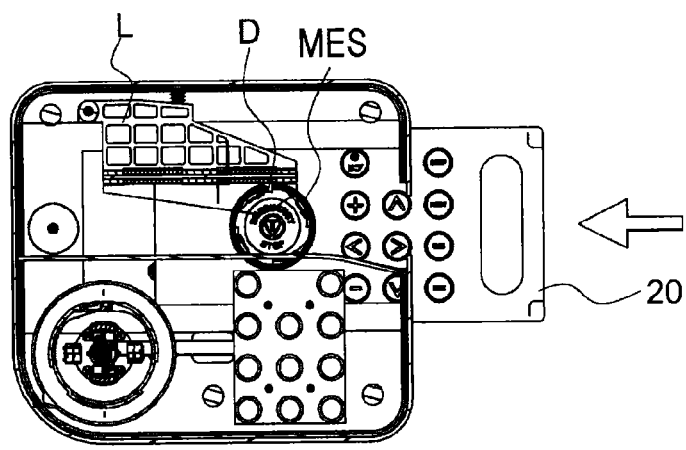
FIGS. 6A to 6D represent a second embodiment of the means for unlocking the mobile emergency stop button when the latter is inserted into its cavity.
Figure 6B:
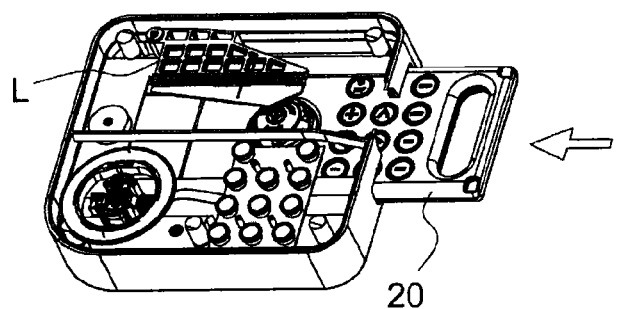
Figure 6C:
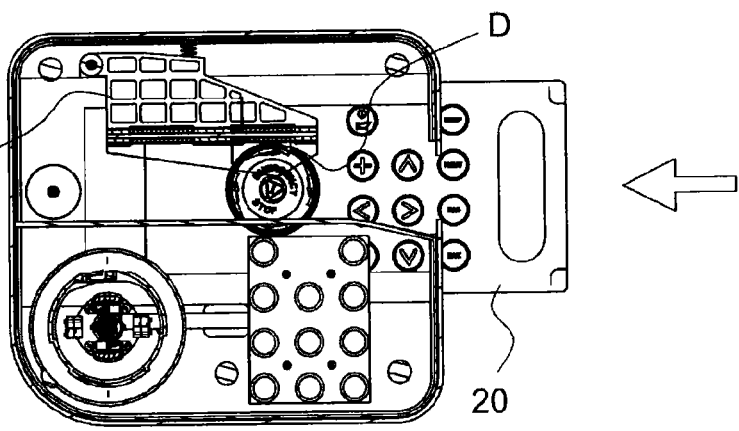
Figure 6D:
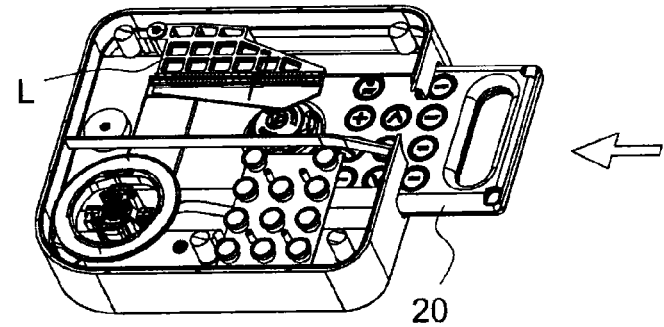

A second embodiment of the unlocking means, represented in FIGS. 6A to 6D, is described in connection with the second embodiment of the control system as mentioned above (FIGS. 2A and 2B). The second solution comprises a pivoting lever L mounted inside the control console and comprising a finger D capable of cooperating with a notch E of the unlocking ring B of the mobile emergency stop button. Referring to FIG. 6A, if the knob of the mobile emergency stop button MES has been pushed in and the mobile support 20 is inserted through the opening 50 in order to store the tablet, the finger D present at the end of the lever is arranged in order to come in contact with a notch E of the unlocking ring in order to drive the ring B in rotation when the mobile support 20 is pushed through the opening 50. The rotation of the ring B frees the knob so that it can be lifted from its actuated position to its inactive position.

Figure 7A:
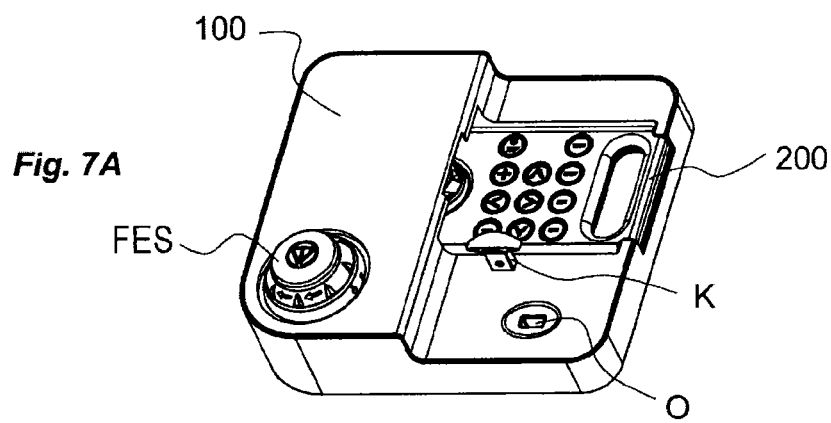
FIGS. 7A to 7D illustrate the operating principle of a solution for retaining the mobile control unit.
Figure 7B:
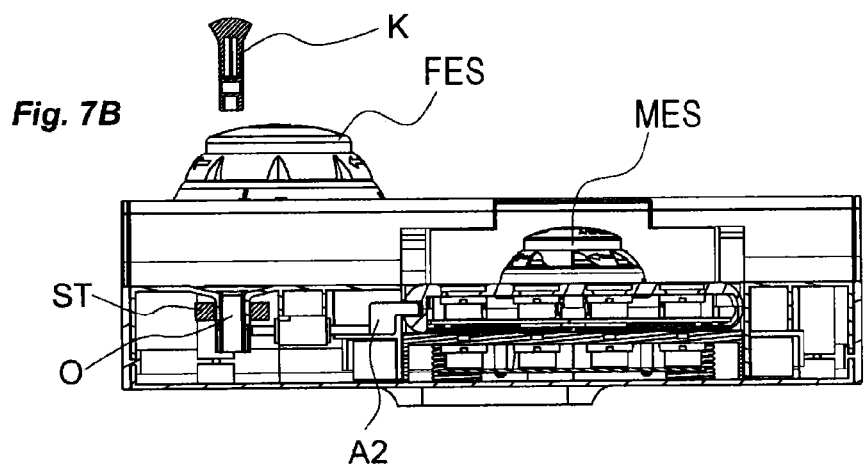
Figure 7C:
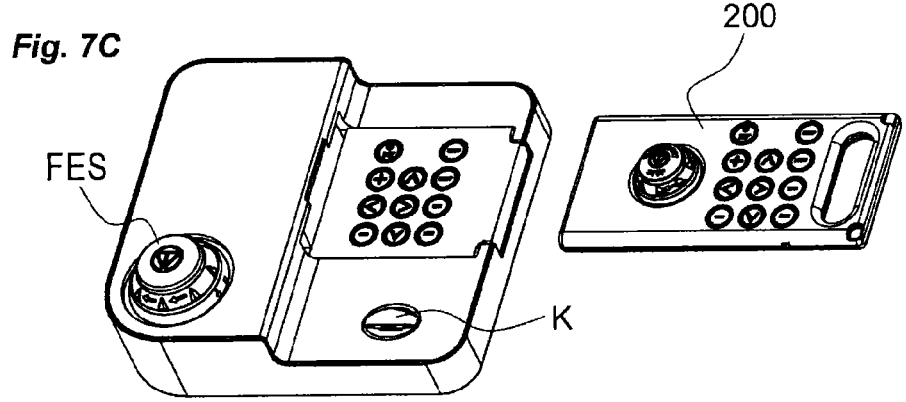
Figure 7D:
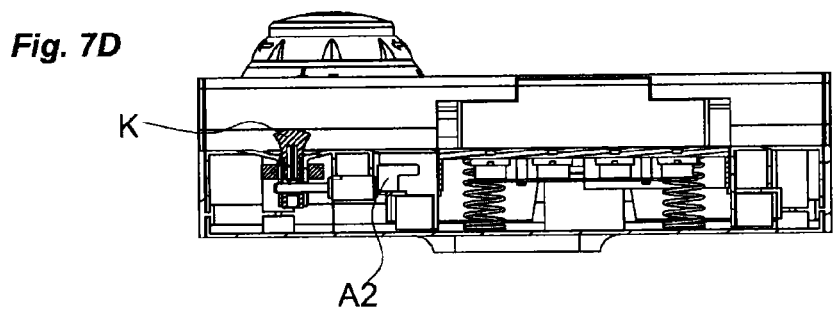

According to the invention, the control system also comprises means for retaining the mobile support 2, 20, 200 in the control console 1, 10, 100. Such a solution is illustrated by FIGS. 7A to 7D for a control system as defined in the third embodiment and its variant, which were described above. These means comprise, for example, a control mechanism and a member for locking the mobile support 200 in its stored position. This locking mechanism comprises, for example, an electromagnet A2 controlled by the control mechanism. The control mechanism comprises, for example, a key K provided with a radio tag and an orifice O, which is formed in the control console and in which a station ST for reading the radio tag, making it possible to identify the key K introduced, is positioned. Initially, the mobile support 200 is locked in its stored position (FIGS. 7A and 7B). Introduction of the appropriate key K makes it possible to actuate the electromagnet A2, which unlocks the mobile support 200, allowing it to be taken out (FIG. 7C). The introduced key K is then locked in the control console (FIG. 7D). When the mobile support is stored in the control console, an end-of-travel sensor makes it possible to detect this position, again leading to locking of the mobile support 200 and release of the key K, which can then be retrieved by the operator.

The invention claimed is:

1. A control system, comprising:
   a fixed control console and a first emergency stop button positioned on the control console, wherein the first emergency stop button controls an electric circuit;
   a mobile control unit comprising a mobile support and a second emergency stop button arranged on the mobile support, wherein the second emergency stop button controls the electric circuit;
   wherein the control console comprises at least one cavity,
   the mobile support occupies a first position, in which the second emergency stop button is concealed from a view of a user inside the at least one cavity, and a second position, in which the second emergency stop button is outside the at least one cavity, and
   the fixed control console includes a locking mechanism that retains the mobile support in the first position, and that releases the mobile support from the first position upon insertion of a key into the locking mechanism.

2. The system as claimed in claim 1, wherein the control console comprises a first retractable flap closing access to the at least one cavity.

3. The system as claimed in claim 2, wherein the control console comprises a second retractable flap closing access to a recess configured to receive the mobile support.

4. The system as claimed in claim 3, wherein the second retractable flap carries a fixed control interface.

5. The system as claimed in claim 1, wherein the control console comprises a lateral opening leading onto a storage space for the mobile support, the storage space comprising the at least one cavity configured to receive the second emergency stop button.

6. The system as claimed in claim 1, wherein the mobile support is in a form of a tablet on which the second emergency stop button is arranged, and the mobile control unit comprises an additional control interface arranged on the mobile support.

7. The system as claimed in claim 1, wherein the control console comprises an electrical charger configured to charge a battery of the mobile control unit when the mobile support is in the first position.

8. The system as claimed in claim 1, wherein the locking mechanism includes an electromagnet that is actuated upon insertion of the key.

9. The system as claimed in claim 1, wherein the key includes a radio tag to identify the key, and the locking mechanism releases the mobile support from the first position based on identification of the key using the radio tag.

* * * * *